(12) United States Patent
Mani et al.

(10) Patent No.: US 10,805,196 B2
(45) Date of Patent: Oct. 13, 2020

(54) PACKET LOSS AND BANDWIDTH COORDINATION

(71) Applicant: Imagination Technologies Limited, Kings Langley (GB)

(72) Inventors: Senthil Kumar Mani, Hyderabad (IN); Bala Manikya Prasad Puram, Hyderabad (IN)

(73) Assignee: Imagination Technologies Limited, Kings Langley (GB)

( * ) Notice: Subject to any disclaimer, the term of this patent is extended or adjusted under 35 U.S.C. 154(b) by 422 days.

(21) Appl. No.: 14/932,331

(22) Filed: Nov. 4, 2015

(65) Prior Publication Data

US 2016/0127215 A1    May 5, 2016

(30) Foreign Application Priority Data

Nov. 4, 2014    (GB) .................................. 1419663.8

(51) Int. Cl.
*H04L 12/26* (2006.01)
*H04L 12/825* (2013.01)
(Continued)

(52) U.S. Cl.
CPC ...... *H04L 43/0829* (2013.01); *H03M 13/353* (2013.01); *H04L 1/0002* (2013.01);
(Continued)

(58) Field of Classification Search
None
See application file for complete search history.

(56) References Cited

U.S. PATENT DOCUMENTS 7,111,058 B1    9/2006  Nguyen et al.
2004/0233844 A1*  11/2004  Yu .................. H04L 12/5602
                                                370/230

(Continued)

FOREIGN PATENT DOCUMENTS

EP        1690420 A1     8/2006
EP        2256991 A1    12/2010
WO    2005002156 A1     1/2005

OTHER PUBLICATIONS

Matsuzono et al. "Adaptive rate control with dynamic FEC for real-time DV streaming" Proceedings of the IEEE Global Telecommunications Conference, 2008, pp. 1-6.

(Continued)

*Primary Examiner* — Alex Skripnikov
(74) *Attorney, Agent, or Firm* — Potomac Law Group, PLLC; Vincent M DeLuca

(57) ABSTRACT

A method of transmitting a stream of packets over a network, the method comprising the steps of: a transmitting device maintaining a measure of network quality; analyzing the measure of network quality so as to determine whether the bandwidth of the network is degrading, beyond a predetermined threshold, the network quality for a transmission over the network; the transmitting device determining a transmission bitrate and a proportion of redundancy in dependence on the analysis; the transmitting device packetising media data and redundancy data in dependence on the determined proportion to generate a stream of packets; and the transmitting device transmitting the generated stream at a rate commensurate with the determined transmission bitrate.

20 Claims, 3 Drawing Sheets

(51) Int. Cl.
| | |
|---|---|
| H04L 29/06 | (2006.01) |
| H04L 1/00 | (2006.01) |
| H04L 12/801 | (2013.01) |
| H03M 13/35 | (2006.01) |
| H04L 12/811 | (2013.01) |
| H04M 15/00 | (2006.01) |
| H04W 24/08 | (2009.01) |

(52) U.S. Cl.
CPC ........ *H04L 43/087* (2013.01); *H04L 43/0864* (2013.01); *H04L 47/11* (2013.01); *H04L 47/25* (2013.01); *H04L 47/38* (2013.01); *H04L 65/80* (2013.01); *H04M 15/56* (2013.01); *H04W 24/08* (2013.01); *H04L 1/0009* (2013.01)

(56) References Cited

U.S. PATENT DOCUMENTS

| | | | | |
|---|---|---|---|---|
| 2010/0328528 | A1 | 12/2010 | Eggert | |
| 2011/0158253 | A1* | 6/2011 | Dukkipati | H04L 1/0002 370/465 |
| 2012/0287986 | A1* | 11/2012 | Paniconi | H04N 19/115 375/240.02 |
| 2013/0010800 | A1* | 1/2013 | Ilan | H04L 1/0084 370/400 |
| 2016/0028992 | A1* | 1/2016 | Heatley | H04L 41/083 348/14.13 |
| 2016/0164759 | A1* | 6/2016 | Satoda | H04L 65/605 709/224 |

OTHER PUBLICATIONS

Balan D et al. "An approach of video VoIP communications using emulated network bandwidth control environment", Signals, Circuits and Systems (ISSCS), 2011 10th International Symposium on, pp. 1-4.

Alj et al. "Admission control and bandwidth management for VLANs", High Performance Switching and Routing, 2001 IEEE Workshop on, 2001, pp. 130-134.

Marchese et al. "Management of VoIP and mission critical data traffic over heterogeneous military networks", Military Communications Conference, 2005. MILCOM 2005. IEEE, Oct. 2005, vol. 5, pp. 3251-3257.

Wang et al. "Session recognition and Bandwidth Guarantee for Encrypted Internet Voice Traffic : Case Study of Skype", Computational Intelligence and Data Mining, 2007. CIDM 2007. IEEE Symposium on, 2007, pp. 384-389.

Daengsi et al. "A study of perceptual VoIP quality evaluation with thai users and codec selection using voice quality—Bandwidth tradeoff analysis" ICT Convergence (ICTC), 2013 International Conference on Oct. 14-16, 2013.

Yanfeng et al. "Bandwidth Allocation Algorithm of VoIP Based on the Adaptive Linear Prediction in the IEEE 802.16 System" ITS Telecommunications Proceedings, 2006 6th International Conference on Jun. 2006.

Johansson et al. "Bandwidth efficient AMR operation for VoIP" Speech Coding, 2002, IEEE Workshop Proceedings. Oct. 6-9, 2002.

Narbutt et al. "Effect of free bandwidth on VoIP Performance in 802.1lb WLAN networks" Irish Signals and Systems Conference, 2006. IET Jun. 28-30, 2006.

Ali et al. "A Comparative Study of Bandwidth Requirements of VoIP Codecs over WiMax Access Networks" Next Generation Mobile Applications, Services and Technologies, 2009. NGMAST '09. Third International Conference on Sep. 15-18, 2009.

Ngamwongwattana et al. "Effect of packetization on VoIP performance" Electrical Engineering/Electronics, Computer, Telecommunications and Information Technology, 2008. ECTI-CON 2008. 5th International Conference on (vol. 1 ) May 14-17, 2008.

\* cited by examiner

PACKET LOSS AND BANDWIDTH COORDINATION

BACKGROUND OF THE INVENTION

This invention relates to methods and devices for managing the transmission of a media stream in changeable network conditions.

Real-time streaming of multimedia content over the internet has become an increasingly common application in recent years. A wide range of multimedia applications, such as on-demand TV, live TV viewing, video conferencing, net meetings, video telephony, voice over internet protocol (VoIP) and many others rely on end-to-end streaming solutions. Unlike a "downloaded" media file, which may be retrieved first in "non real-time" and viewed or played back later, streaming media applications require a media source to encode and to transmit a media signal over a network to a media receiver, which must decode and play the media signal in real time.

Problems can arise when a media stream is transmitted across a network, such as the Internet. For example, a significant packet loss rate across the transmission network often requires re-transmission of the lost data packets. Typically, a lost data packet needs to be recovered prior to the time the media data in the packet is scheduled to be decoded to be played. If the lost packet is not received in time, the media that is played out, at the time that the media data in the lost data packet is scheduled to be played out, is likely to be erroneous. For example, in VoIP, a VoIP stream can be impaired by routing, queuing, scheduling and serialization effects, which result in loss and jitter (including delays) to data packets. Factors that can affect the stream quality, and therefore the voice quality at the receiving device, are delay and packet loss which cannot generally be known in advance to the receiving device because they depend on the real-time behaviour of connections throughout the network. Thus some error correction methods are needed.

One method of error correction is to introduce redundancy into the transmission. The receiver can use redundant data to regenerate packets that are lost in the network. The amount of redundant data transmitted depends on the voice quality required at the receiving end. For good voice quality, a large amount of redundant data is required. Due to the large amount of redundant data, the bandwidth requirements can become significant. Unavailability of sufficient bandwidth for packet based voice communication may further worsen the call quality.

Generally, when a transmitting device detects an increase in packet loss, it would increase the amount of redundancy it transmits during a voice call so that the quality of a call can be maintained. However, this may lead to further degradation in the quality of the call if the network has limited bandwidth as the transmission bitrate for the call may then exceed the network bandwidth due to the additional amount of redundancy.

There is a need for a method of managing and adapting the transmission of media over networks having changeable properties so as to optimise, or improve, the quality of a media stream received at a receiving device.

BRIEF SUMMARY OF THE INVENTION

According to a first aspect of the disclosure there is provided a method of transmitting a stream of packets over a network, the method comprising the steps of: a transmitting device maintaining a measure of network quality; the transmitting device analyzing the measure of network quality so as to determine whether the bandwidth of the network is degrading, beyond a predetermined threshold, the network quality for a transmission over the network; the transmitting device determining a transmission bitrate and a proportion of redundancy in dependence on the analysis; the transmitting device packetising media data and redundancy data in dependence on the determined proportion to generate a stream of packets; and the transmitting device transmitting the generated stream at a rate commensurate with the determined transmission bitrate.

The step of analysing the measure of network quality may comprise determining a change in the measure of network quality, wherein the transmission bitrate and the proportion of redundancy is determined in dependence on the change in network quality.

The step of analysing the measure of network quality may comprise detecting a change of delay in the network in dependence on the measure of network quality, wherein the transmission bitrate and the proportion of redundancy is determined in dependence on the change in delay.

The step of determining the transmission bitrate and the proportion of redundancy may comprise, if the detected change is an increase in the delay, determining a transmission bitrate that is lower than a current transmission bitrate.

The transmitting step may comprise transmitting at the determined lower transmission bitrate, the method may further comprise maintaining transmission of the stream at the lower transmission bitrate for a predetermined amount of time irrespective of detected changes of delay during the predetermined amount of time.

The step of determining the transmission bitrate and the proportion of redundancy may comprise, if the detected change is an increase in the delay, determining a proportion of redundancy that is lower than a current proportion of redundancy.

If the detected change is an increase in the delay, the method may further comprise determining that the bandwidth of the network is less than the current transmission bitrate.

The step of analysing the measure of network quality may comprise detecting a change in the packet loss in dependence on the measure of network quality, wherein the step of determining the transmission bitrate and the proportion of redundancy further comprises determining the proportion of redundancy in dependence on the change in packet loss.

The step of determining the transmission bitrate and the proportion of redundancy may comprise, if the detected changes are an increase in packet loss and a decrease in delay, determining a proportion of redundancy that is higher than a current proportion of redundancy and determining a transmission bitrate that is higher than a current transmission bitrate.

The step of determining the transmission bitrate and the proportion of redundancy may comprise, if the detected changes are an increase in packet loss and a decrease in delay, determining a proportion of redundancy that it is higher than a current proportion of redundancy and determining the transmission bitrate in dependence on a measure of packet loss.

If the detected changes are an increase in packet loss and a decrease in delay, the method may further comprise determining that the lossyness of the network has increased.

The step of determining the transmission bitrate and the proportion of redundancy may comprise, if the bandwidth of the network is significantly degrading the network quality for the transmission over the network, determining a transmission bitrate that is lower than the current transmission bitrate.

The transmitting step may comprise transmitting at the determined lower transmission bitrate, the method may further comprise maintaining transmission of the stream at the lower transmission bitrate for a predetermined amount of time irrespective of detected changes in the measure of network quality during the predetermined amount of time.

The step of determining the transmission bitrate and the proportion of redundancy may comprise determining a proportion of redundancy that is lower than a current proportion of redundancy.

The analysing step may comprise, if the bandwidth of the network is not significantly degrading the network quality for the transmission over the network, determining that the lossyness of the network has increased.

The analysing step may comprise detecting a decrease in delay in the network; and the step of determining the transmission bitrate and the proportion of redundancy may comprise determining a proportion of redundancy that is higher than a current proportion of redundancy and determining a transmission bitrate that is higher than the current transmission bitrate.

The measure may be dependent on measuring a time between expecting to receive a packet of a media stream and receiving said expected packet.

The measure of network quality may be dependent on measuring a network delay time, the delay time comprising a time taken for a first packet to be received at a first device from a second device and a time taken for a second packet to be received at the second device from the first device.

The second packet may comprise an indication of a time when the first packet was generated.

The measure of network quality may comprise one or more of: a measure of network delay; a measure of delayed reception of packets; a measure of packet loss over the network; a measure of network jitter; and a measure of burst loss.

The measure of quality may comprise: a first measure consisting of: the measure of network delay; the measure of delayed reception of packets; the measure of packet loss over the network; the measure of network jitter; and the measure of burst loss; and a second measure consisting of: the measure of delayed reception of packets; the measure of packet loss over the network; the measure of network jitter; and the measure of burst loss.

The maintaining step may comprise receiving a network statistics report comprising out-of-order packet statistics for packets previously sent for transmission over the network.

The maintaining step may comprise receiving a or the network statistics report wherein the network statistics report comprises lost packet statistics for packets previously sent for transmission over the network.

The step of determining the proportion of redundancy may further comprise: unpacking the lost packet statistics to generate a packet loss distribution buffer; finding a location in the packet loss distribution buffer by matching one or more values in the buffer to a set of one or more predetermined values; and determining the proportion of redundancy in dependence on the location in the packet loss distribution buffer.

The step of determining the proportion of redundancy may further comprise: determining an aggregate packet loss statistic from the lost packet statistics and deriving the proportion using a look up-table based on the aggregate packet loss statistic.

The maintaining step may comprise: receiving a network statistics report comprising consecutive packet loss statistics for packets previously sent for transmission over the network.

The proportion of redundancy may be determined in dependence on a histogram having a plurality of bins, each bin representing a number of consecutive missing data packets and having a frequency indicating a number of occurrences of that number of consecutive missing data packets.

The stream may be a Voice over Internet Protocol stream.

The packetising step may comprise packetising in accordance with the RTP Realtime Transport Protocol) protocol standard.

According to a second aspect of the disclosure there is provided a device for transmitting a stream of packets over a network, the device comprising one or more processors, one or more computer-readable tangible storage devices, and program instructions stored on at least one of the one or more storage devices for execution by at least one of the one or more processors, the combination of said processor and program instructions comprising: a quality estimator configured to maintain a measure of network quality; a quality manager configured to: analyze the measure of network quality so as to determine whether the bandwidth of the network is degrading, beyond a predetermined threshold, the network quality for a transmission over the network; and determine a transmission bitrate and a proportion of redundancy in dependence on the analysis; and a packetiser configured to packetise media data and redundancy data in dependence on the determined proportion to generate a stream of packets. The devices further comprises a transceiver configured to transmit the generated stream at a rate commensurate with the determined transmission bitrate.

The quality manager may be further configured to detect a change of delay in the network in dependence on the measure of network quality, wherein the transmission bitrate and the proportion of redundancy are determined in dependence on the change in delay.

The quality manager may be configured to determine a transmission bitrate that is lower than a current transmission bitrate if the detected change is an increase in the delay.

The quality manager may be configured to maintain the lower transmission bitrate for a predetermined amount of time irrespective of detected changes of delay during the predetermined amount of time.

The quality manager may be configured to determine a proportion of redundancy that is lower than a current proportion of redundancy if the detected change is an increase in the delay.

The quality manager may be configured to determine that the bandwidth of the network is less than the current transmission bitrate if the detected change is an increase in the delay.

The quality manager may be configured to detect a change in the packet loss in dependence on the measure of network quality and determine the proportion of redundancy in dependence on the change in packet loss.

The quality manager may be configured to determine that the lossyness of the network has increased jf the detected changes are an increase in packet loss and a decrease in delay.

According to a third aspect of the disclosure there is provided machine readable code for generating a device as described above.

According to a fourth aspect of the disclosure there is provided a machine readable storage medium having encoded thereon non-transitory machine-readable code for generating a device as described above.

According to a fifth aspect of the disclosure there is provided machine readable code for implementing a method as described above.

According to a sixth aspect of the disclosure there is provided a machine readable storage medium having encoded thereon non-transitory machine-readable code for implementing a method as described above.

BRIEF DESCRIPTION OF THE DRAWINGS

The present invention will now be described by way of example with reference to the accompanying drawings. In the drawings.

DETAILED DESCRIPTION OF THE DRAWINGS

The following description is presented to enable any person skilled in the art to make and use the invention, and is provided in the context of a particular application. Various modifications to the disclosed embodiments will be readily apparent to those skilled in the art.

The general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
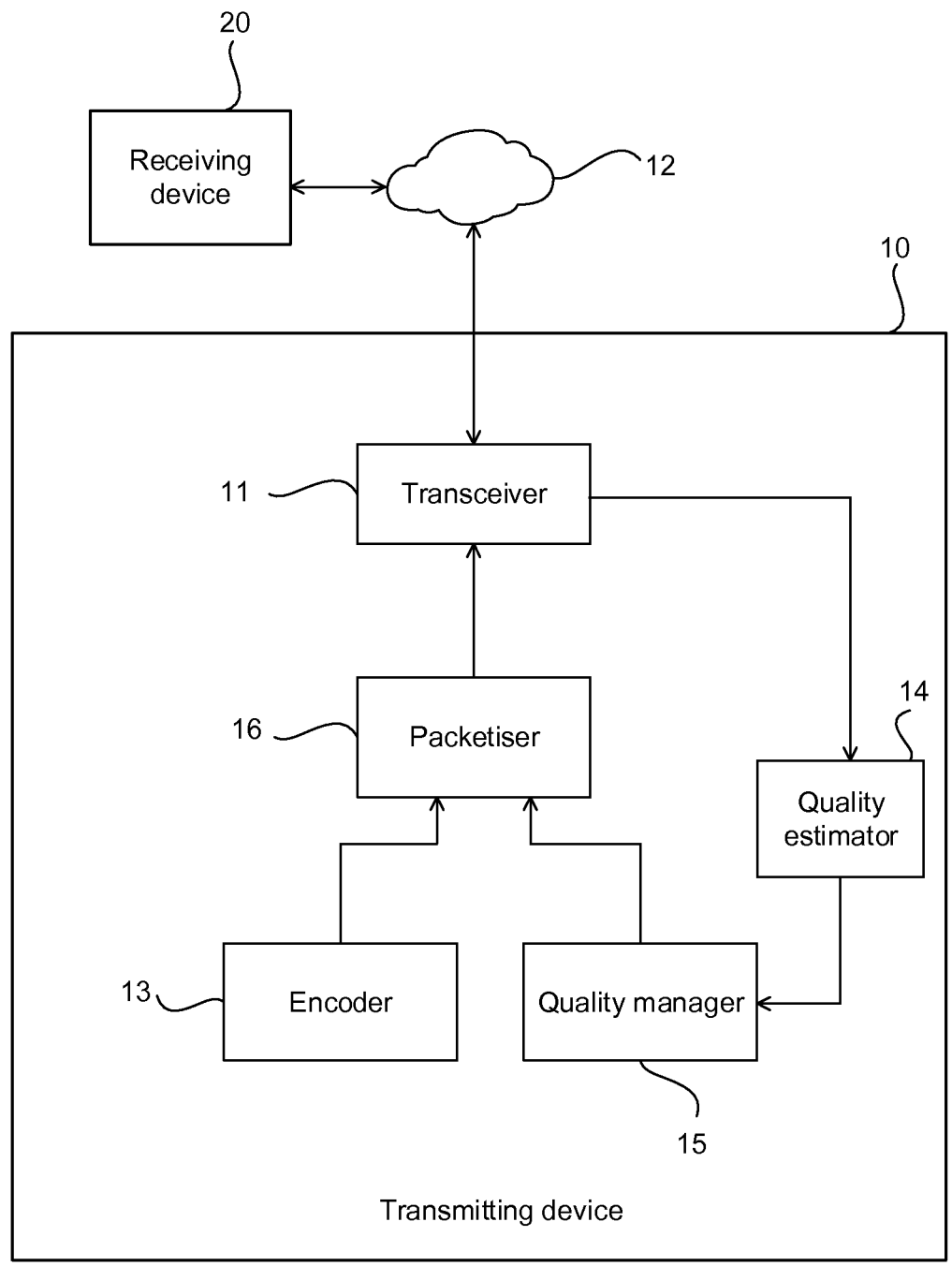
FIG. 1 shows a device capable of transmitting a stream of packets over a network.

FIG. 1 depicts a transmitting device 10, which may be any suitable device that is capable of generating packet based data, such as a computer, smartphone, IP-phone, etc. The transmitting device 10 comprises a transceiver 11 for connection to a communications network 12 such as the internet or other packet based networks. The transmitting device 10 may transmit and/or receive data packets to and/or from the communications network 12 via the transceiver 11. The transmitting device 10 comprises an encoder 13 for encoding media that is to be transmitted over the communications network 12 to a receiving device 20.

The transmitting device 10 comprises a quality estimator 14, or first program instructions, that can estimate the quality of a transmission path from the transmitting device 10 to the receiving device 20 through the network 12, and a quality manager 15, or second program instructions, that can determine parameters in accordance with which media is to be transmitted over the network 12. The quality manager 15 may determine the transmission parameters in dependence on the estimate of the quality of the network 12. A change in the quality estimate may indicate a change in the condition or state of the network 12. The transmission parameters may be adapted by the quality manager 15 to provide an optimal stream for the new state of the network 12.

The quality estimator 14 may receive a network statistics report from the network 12 via transceiver 11. In an example, the quality estimator 14 may receive the network statistics report from the receiving device 20 via the network 12. The quality estimator 14 is capable of unpacking or decoding packet loss statistics and/or out-of-order packet statistics from the network statistics report. The network statistics report may be a Real-time Transport Control Protocol (RTCP) report. The quality estimator 14 may determine one or more quality measures from the network statistics report and provide those determined measures to the quality manager 15. For example, the quality estimator 14 may estimate a redundancy value using the information from the network statistics report (as further described below) and provide that redundancy value to the quality manager 15. The quality manager 15 may use further measures from the quality estimator 14 and, optionally, other information about the media data to be transmitted to further optimise the redundancy value.

Device 10 comprises a packetiser 16, or third program instructions, which receives the media data payload from the encoder 13. Based on the redundancy value received from the quality manager 15, the packetiser 16 may generate a media data packet comprising the media data payload as the primary payload. The packetiser 16 may access information about previous media data payloads from a buffer (not shown). The previous media data payloads may be included in the media data packet as redundant data and/or included in separate redundant packets (e.g. FEC packets). If the redundant data is sent in FEC packets, those packets may be sent as part of the same or a different packet stream as the media data packets.

In one example, the packetiser 16 may packetise the data according to the RFC2198 packet handling scheme. RFC2198 provides the RTP payload format for the transmission of the encoded media data in a redundant fashion and does not require any mathematical reversible codec at the sender or receiver. When using this scheme, the redundancy value may specify the number of redundant payloads included in an RFC2198 packet. In another example, the packetiser 16 may packetise the data according to an FEC scheme. When using this scheme, the redundancy value may specify a number of FEC packets to be transmitted per a number of media packets (i.e. an FEC span).

The quality estimator 14 may directly test network quality measures such as the available bandwidth by using dedicated testing methods that are known in the art. Alternatively or additionally, the quality estimator 14 may determine an indication of the network quality by using certain parameters associated with packets (e.g. RTP packets) that are already being used for communicating media between the transmitting and receiving devices 10 and 20. For example, the network quality may be determined using one or a combination of the following measures:

1) Network delay. High network delay values can indicate that a larger number of packets are accumulated either in the device network driver or in the network. This may be, for example, because the transmitting device 10 is transmitting at a bitrate that is higher than the available bandwidth of the network 12 which can lead to a backlog of packets. The network delay values indicate the time taken for packets to travel from the transmitting device 10 to the receiving device 20 and/or from the receiving device 20 to the transmitting device 10.

Figure 2:
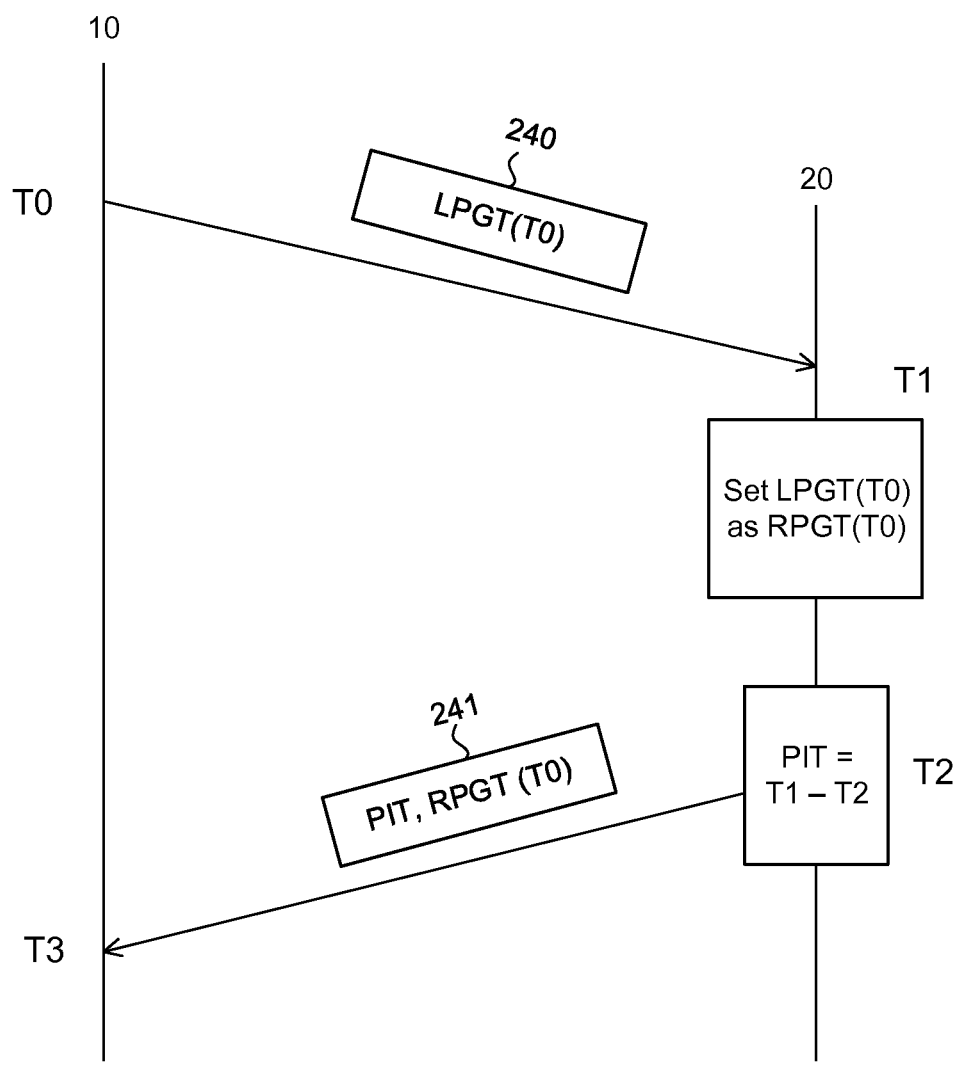
FIG. 2 depicts a process for estimating network delay.

FIG. 2 depicts one example of how network delay can be measured. Packets 240 and 241 may be packets for communicating media or other data (such as network statistics) between the transmitting and receiving devices 10 and 20. The packets 240 and 241 may each have one or more of the following information contained within it: Local Packet Generation Time (LPGT) and/or Remote Packet Generation Time (RPGT) and/or Packet Idle Time (PIT).

When devices 10 and 20 are communicating, for example during a VoIP call, every packet transmitted for the call may incorporate the LPGT information, which for packet 240 is T0. When packet 240 is received at device 20, the time instant at reception (T1) is measured and when device 20 sends the next packet 241, the time elapsed between the time at reception of the last packet 240 and the time of transmission (T2) of the current packet 241 is incorporated into the packet 241 as the PIT (i.e. PIT=T2−T1 in the example shown in FIG. 2). The packet generation time at device 10 (i.e. T0) of the last received packet 240 is included in packet 241. Device 10 can then estimate the network delay for a round trip from the information in packet 241 as:

Network delay=packet 241 received time (T3)−RPGT (T0)−PIT (T2−T1)

Therefore, the network delay=(T1−T0)+(T3−T2), which is the time spent in transmission over the network for a round trip.

The network delay value may be influenced by factors such as the number of network gateways in the network between devices 10 and 20. The influence of these gateways to the network delay may generally be constant. To account for the delay caused by the gateways, a number of network delay measurements may be taken (e.g. between 75 and 125 and preferably around 100) and then the average of a number of minimal delay values (e.g. the four lowest values) can be determined. The determined value provides the average round trip delay caused by the gateways in both directions. Half of this average can be used to estimate the delay caused by the gateways in a single direction (assuming that the delay is the same in both directions). Thus, for subsequently measured network delay values, the halved average can be used as a fixed value to subtract from subsequent measured network delay values to account for the delay caused by the gateways.

2) Packet reception gap. The packet reception gap can indicate when continuous streams of packets are being lost or stuck in the network. This may lead to breaks in, for example, voice calls which may be dropped if the packet reception gap value is high. One way of sustaining a voice call whenever the packet reception gap is high is for the transmitting device to reduce the transmission bitrate so that packets can reach the receiving device and the voice call can be maintained.

During a media stream, the receiving device 20 may expect to receive packets at certain times as part of the stream. For example, a packet may contain a portion of media that should be played back at the receiving device 20 in a certain order and/or at a certain time. The time elapsed between expecting to receive a packet and actually receiving that packet can indicate the packet reception gap. Alternatively, the packet reception gap can be indicated by counting the number of times a media player at the receiving device 20 (which may require media packets at regular intervals) requests a packet for playing media before actually receiving a media packet.

This packet reception gap may be determined based on the type of packets that are received. For example, in some voice communication systems a silence packet (e.g. a silence descriptor (SID) packet) may be periodically sent (e.g. every 160 ms) during a silent period. Thus the silence packet may not be suitable for measuring the packet reception gap when the network conditions are rapidly changing. Thus, in some scenarios, the packet reception gap may be estimated using packets that contain speech data.

3) Packet Loss. This measure indicates the percentage loss of packets in the network over a specified period.

4) Network jitter. This measure indicates the variation in the time between receiving consecutive packets. The variation may be caused by network congestion, timing drift, route changes, etc. A high value of network jitter indicates that more out-of-order packets are received.

5) Burst Loss. This measure indicates the number of packets in periods of time between the loss of a packet and the start a continuous reception of a predetermined number of good packets.

Each of the measures 1-5 may be measured wholly or partly by the transmitting device 10 and/or the receiving device 20. The transmitting device 10 may receive or derive the values for one or more of the measures 1-5 from the network statistics report. The measure of quality determined by quality estimator 14 may utilise one of or any combination of the above measures 1 to 5. When combining measures, each measure may be weighted differently to reflect their significance in affecting the quality of the network. For example, higher values of network delay and packet reception gap can more clearly indicate bad network conditions and so may be provided with a higher weighting. Thus appropriately weighting each measure when determining a combined measure can provide quicker and more accurate reflection of bad network conditions and allow the quality manager 15 to quickly adapt the transmission parameters of the media stream.

The values of each measure (or a combination of the measures) can provide an estimate of the quality of the network. When the quality of the network increases or decreases, each value (or a combination of the values) can correspondingly change to indicate the increase or decrease in the quality of the network.

As mentioned above, the quality estimator 14 may receive a network statistics report having lost packet and/or out-of-order packet statistics. The packet loss measured in those statistics may be due to a number of factors such as excess bandwidth utilisation and/or packet loss in the network. In one example where the receiving device 20 is collating the statistics from packets transmitted by device 10 (and/or vice versa), transmitted packets may be lost because device 10 is transmitting at a bitrate that is higher than the available network bandwidth and/or because of a lossy network.

When compensating for packet loss, it can be advantageous to determine the cause of the packet loss so that an appropriate form of compensation can be applied by the transmitting device 10. If, for example, the cause of the packet loss was due to a transmission bitrate greater than the available network bandwidth, then increasing redundancy would be an inappropriate form of compensation as this may increase the transmission bitrate further. Thus, it can be advantageous to determine the cause of the packet loss. In particular, it can be advantageous to determine whether packet loss is caused by insufficient network bandwidth being available, and if so, controlling a packet loss mitigation technique (e.g. controlling redundancy depth, FEC span or duplication rate) in conjunction with a dynamic bandwidth adaptation technique, so that the packet loss is not worsened by the packet loss mitigation technique. For example, a measure of network quality can be analysed so as to determine whether the bandwidth of the network is significantly degrading the network quality for a transmission over the network, and in dependence on that analysis, a transmission bitrate and a proportion of redundancy can be determined.

When the measured quality of the network changes, the quality manager 15 may determine a cause for that change. The cause may be determined from, for example, one or more of the measures of network quality and/or the network statistics. When the cause has been determined, an appropriate form of compensation can be selected and applied. For example, if the packet loss is caused by transmitting at bitrate that is greater than the available bandwidth, then the transmitting device 10 can reduce its transmission bitrate so that a larger proportion of the transmitted packets are capable of arriving at the receiving device 20. If, rather, the loss is caused by a lossy network, then the transmitting device 10 can increase the amount redundancy to compensate for the lossy network so that more packets are capable of being recovered at the receiving device 20.

One way of determining the cause of packet loss is by measuring the time taken (i.e. the delay) for packets transmitted by a transmitting device to be received at a receiving device. If there is an increase in the measured packet loss and an increase in the measured delay, then this may indicate that the transmission bitrate for the packet stream is greater than the available bandwidth. The quality manager 15 may then decrease the transmission bitrate to compensate for the reduction in available bandwidth. The quality manager 15 may also reduce the amount of redundancy data to be transmitted to further reduce the transmission bitrate. The packetised media and redundancy data may then be transmitted at the reduced bitrate. In contrast, if there is an increase in the measured packet loss without an increase in the measured delay, then this may indicate that the available bandwidth in the network is not the predominant cause (or a significant cause) of the packet loss and, as such, packet loss mitigation techniques can be implemented, e.g. to increase the amount of redundancy in the transmitted packet stream, to thereby attempt to decrease the level of packet loss.

Below is one example of how the cause for the change in the network quality can be determined from the network statistics and measures described above. The example demonstrates one way of determining if there is a change in the network delay. Other methods of determining the cause for the change in the network quality and the network delay may be used.

The quality estimator 14 may derive three different measures of network quality from the received network statistics: QDF1, QDF2 and Max Nr, where QDF stands for Quality Degradation Factor.

QDF1

This measure is based on a weighted sum of measures 1) to 5) described above: network delay, packet reception gap, packet loss, network jitter and burst loss. Each of the measures may have a different weighting. One example of how each measure is weighted is shown in table 1. Other weightings are possible.

TABLE 1

| Measure | Weighting Factor |
| --- | --- |
| Network Delay | 0.3 |
| Packet reception gap | 0.3 |
| Packet loss | 0.1 |
| Network jitter | 0.1 |
| Burst loss | 0.2 |

QDF2

This measure is based on a weighted sum of measures 2) to 5) above: packet reception gap, packet loss, network jitter and burst loss. Each of the measures may have a different weighting. One example of how each measure is weighted is shown in table 2. Other weightings are possible.

TABLE 2

| Measure | Weighting Factor |
| --- | --- |
| Packet reception gap | 0.1 |
| Packet loss | 0.5 |
| Network jitter | 0.2 |
| Burst loss | 0.2 |

Since QDF2 is estimated form all the parameters used to estimate QDF1 except network delay, the difference between QDF1 and QDF2 provides an indication of the network delay in the network 12.

A measure of the variation in the network delay ($dly_v$) can be determined by determining the variation in QDF1 ($QDF_{1v}$) and QDF2 ($QDF_{2v}$) and then dividing $QDF_{1v}$ by $QDF_{2v}$, as shown in the equations below.

$$QDF_{1v}(n) = \frac{QDF_1(n)}{QDF_1(n-1)}$$

$$QDF_{2v}(n) = \frac{QDF_2(n)}{QDF_2(n-1)}$$

$$dly_v(n) = \frac{QDF_1(n)}{QDF_2(n)}$$

where n is the measurement instance.

Max Nr

This measure is a maximum redundancy value that is derived from the lost packet statistics and/or the out-of-order packet statistics.

In one example, the network statistics may be retrieved from the network statistics report for an RTCP packet. For example, the RTCP packet may be an "application-defined RTCP packet" generated by the receiving device 20. In the case of the application-defined RTCP packet, the lost packet statistics and the out-of-order packet statistics may be received as four, 32-bit data blocks. A first 32-bit data block and a second 32-bit data block may refer to lower and higher parts of the lost packet statistics and a third 32-bit data block and a fourth 32-bit data block may refer to the lower and higher parts of the out-of-order packet statistics. In an example, each two bit pair (even and subsequent odd bit) of the lost packet statistics represents a particular quantised loss order. For example, the first 2-bits of the lower part of the lost packet statistics may be extracted to a zero-th position of a packet loss order distribution buffer. Similarly the third bit and the fourth bit of the lower part of the lost packet statistics may be extracted to a first position of the packet loss order distribution buffer. In the same way all the 32 bits of the lower part of the lost packet statistics may be unpacked into the packet loss order distribution buffer, from the zero-th position of the packet loss order distribution buffer to a fifteenth position of the packet loss order distribution buffer.

The first 2-bits of the higher parts of the lost packet statistics may be extracted to a sixteenth position of the packet loss order distribution buffer. Similarly the remaining bits of the higher order of the lost packet statistics may be unpacked into the packet loss order distribution buffer, from the seventeenth position of the packet loss order distribution buffer to a twenty-ninth position of the packet loss distribution buffer. In this example, bits 27 to 31 of the higher part are not used.

In this example, the unpacked distribution buffers will have the values from 0 to 3 at each position (due to each position containing 2 bits). Each 2-bit value at a given position represents a value or range for a histogram of the network packet loss statistics, as illustrated in table 3 below. The histogram may represent the distribution of consecutively lost packets, such that the position in the buffer represents the number of consecutively lost packets, and the value represents the frequency.

TABLE 3

| 2-Bit Value in Distribution Buffer | Value Representation |
|---|---|
| 0 | 0 |
| 1 | 1 or 2 |
| 2 | 3 to 7 |
| 3 | Greater than 8 |

In a similar manner, the lower and higher parts of the out-of-order packet statistics may be unpacked to create an out-of-order distribution buffer in the case of an application-defined RTCP packet. These can be translated to values for a histogram of the network packet out-of-order statistics using a similar table to table 3. For example, the histogram may represent the distribution of consecutive out-of-order packets, such that the position in the buffer represents the number of consecutive out-of-order packets, and the value represents the frequency.

Note that, in other examples, different types of network statistics can also be used, such as percentage packet loss or percentage out-of-order statistics, rather than the statistics described above.

Using the statistics described above, the quality estimator 14 can estimate an appropriate redundancy value (Max Nr) to compensate for the packet loss indicated by the statistics. Max Nr may be calculated in different ways using the network statistics, depending on a mode of operation of the transmitting device 10. Alternatively, the transmitting device 10 may configure the mode of operation depending on the features supported by the receiving device 20.

In a first example, Max Nr may be estimated using an aggregate packet loss statistic and a look-up table for Max Nr. For example, the look-up table may comprise a first predefined list and a second predefined list. The first predefined list may contain a set of values related to the network packet loss statistics, such as the percentage packet loss. The network packet loss may be derived from the lost packet statistics described above or may be directly obtained from an RTCP network statistics report. The second predefined list may contain a set of values related to Max Nr. A table index may be determined from the first predefined list based on the network packet loss, for example as the lowest index of the table having an associated value greater than or equal to the network packet loss. The Max Nr may be derived from the second predefined list as the value at that index. For example, assume the first predefined list to have values of {0,1,5,9,13,17,100} and the second predefined list to have values of {0,2,4,6,8,10,12}. So, for network packet loss of 13, the table index is equal to 4. Hence the corresponding value of the estimated Max Nr from the second predefined list is 8. Note that, in other examples, different types of comparisons or lookups can be used to achieve the same effect.

In another example, Max Nr may be estimated from the packet loss order distribution buffer described above. For example, the packet loss order distribution buffer can be searched to find a location within the packet loss order distribution buffer that has one or more values that match one or more predetermined values. Table 4 illustrates an example packet loss distribution buffer, with the buffer indices shown above the buffer values for convenience. In this example, the predetermined value is zero. A first zero index corresponding to the location of a first zero value in the packet loss distribution buffer may be used to estimate the Max Nr. This would correspond to index 11 in table 4. In another exemplary implementation, the Max Nr can be derived using the value at a location having a predefined relationship to the first zero index, such as the value at the location of zero index minus 2, which corresponds to index 9 in table 4.

TABLE 4

| 0 | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|
| 3 | 3 | 2 | 2 | 2 | 2 | 2 | 2 | 2 | 1 | 1 | 0 | 1 | 1 | 1 | 0 | 1 | 0 | 0 |

| 19 | 20 | 21 | 22 | 23 | 24 | 25 | 26 | 27 | 28 | 29 | 30 | 31 |
|---|---|---|---|---|---|---|---|---|---|---|---|---|
| 0 | 1 | 0 | 0 | 0 | 0 | 0 | 0 | 0 | 0 | 0 | 1 | 0 |

The packet loss order distribution buffer may be filtered, e.g. using a 2D windowed filter, to remove outliers from the packet loss statistics.

In another example, Max Nr may be estimated from a histogram of consecutive packets lost. The histogram may be provided in or derived from the lost packet statistics.

A receiving device may determine the number of times each number of consecutive packets are lost over a period of time. For example, the receiving device can measure the number of times 0, 1, 2, 3, 4, . . . n consecutive packets are not received by the receiving device. This measure may conveniently be represented in a histogram having bins representing n number of consecutive packets lost and the frequency at which each of those n numbers of consecutive packets are lost for a given period of time. The histogram may be sent from the receiving device 20 to the transmitting device 10 in the network statistics report. The quality estimator 14 can receive the histograms and analyse them to determine an appropriate Max Nr.

If the transmitting device is using FEC for error correction, the quality estimator 14 can analyse the histogram to determine an appropriate number r of FEC packets to send for k number of data packets. The quality estimator 14 may determine the lowest number of consecutive packets (i.e. the lowest bin value) that has a predetermined frequency (e.g. a low frequency value such as one or, preferably, zero). Based on this determination, an appropriate (k, r) configuration (i.e. the FEC span) can be determined.

The first zero (or other predetermined value) bin of the histogram represents "Nr" consecutive packets lost in the network. Consecutive losses above Nr will occur very rarely in the network. Thus Nr may be used for determining the (k, r) ratio such that most of the lost data packets can be retrieved at the receiving device. An appropriate (k, r) may be determined so that up to Nr consecutive losses in the transmitted packets transmitted can be incurred and still the data packets can be recovered at the receiving device.

Preferably, the determined (k, r) is an indication of the ratio between a maximum number (r) of FEC packets per k data packets. The number of data packets and FEC packets transmitted may be further fine-tuned from other network measures. Thus, the number of FEC packets per k data packets may be lower (but no greater) than the determined Max Nr according to the (k, r) configuration. For example, if the predetermined frequency is zero and the first (i.e. the lowest value) bin in the histogram that has a frequency of zero is the bin representing 7 consecutive packets, then Max Nr=7. This indicates that the condition of the network is such that there is a low probability of losing 7 consecutive packets and there is a higher probability of loss for less than 7 consecutive packets. From this, the maximum (k, r) configuration can be determined by the quality manager 15. For example, the maximum (k,r) could be selected from a data structure comprising optimal k and r values for each possible Max Nr.

The above examples describe how a value for the Max Nr may be determined by the quality estimator 14. The Max Nr may be determined for each network statistics report received. Several packets may be transmitted between each network statistics report, and therefore, in some examples, the Max Nr may be further refined on a packet level.

Max Nr is then provided to the quality manager 15 which uses the Max Nr value to determine the number of the redundant payloads to be packed with the primary payload for every packet transmission at the nth packet/sequence number or as the FEC span value. For example, the number of the redundant payloads or the FEC span could be selected from a lookup table comprising those values for each possible Max Nr.

As described below, the quality manager 15 may further fine tune the Max Nr received from the quality estimator 14 before using it to determine the redundancy.

Coordinating of QDF1, QDF2 and Max Nr

The quality manager 15 may use a QDFo value that is derived from QDF1 and/or QDF2 (as described below) to determine a transmission bitrate. For example, the quality manager 15 may store a lookup table comprising QDFo values and corresponding transmission bitrates to be used based on the QDFo value. If the QDFo value changes, the quality manager 15 may select a new transmission bitrate from the lookup table corresponding to the changed QDFo value. In this example, increasing values for QFD1 and QFD2 indicate worsening network quality.

Similarly, the quality manager 15 may store a lookup table comprising Max Nr values and a corresponding number of the redundant payloads or an FEC span to be used based on the Max Nr value. In this example, an increasing Max Nr value indicates increasing packet loss.

QDF1, QDF2 and Max Nr may be determined every time a new set of network statistics is received by the quality estimator 14. QDF1, QDF2 and Max Nr may vary over time and the cause of that variation may be determined based on the how each of the measures have varied. For example:

Case 1: when Max Nr is increasing and QDF1 and QDF2 are decreasing. The increase in Max Nr indicates that there is an increase in packet loss. The decreasing QDF1 and QDF2 indicates that the above measures are decreasing and so there is sufficient available bandwidth for the transmitting device. Thus, this case indicates that the cause of the packet loss is due to an increase in the lossyness of the network, not due to insufficient available bandwidth.

Case 2: when Max Nr and QDF1 are increasing and QDF2 is decreasing.

The increase in Max Nr indicates that there is an increase in packet loss. The increase in QDF1 and decrease in QDF2 indicates that the network delay is increasing. The increase in network delay is indicative of either an increase in the bandwidth utilisation (e.g. increasing transmission bitrate) or that the bandwidth availability of the network has decreased. Thus, this case indicates that the cause of the packet loss is due to a decrease in the available bandwidth (either due to an increase in the transmission bitrate or decrease in the available network bandwidth).

Case 3: when Max Nr and QDF2 are increasing and QDF1 is decreasing. The increase in Max Nr indicates that there is an increase in packet loss. The increase in QDF2 and decrease in QDF1 indicates that the network delay is decreasing. The decrease in network delay is indicative of sufficient available bandwidth for the transmitting and/or receiving device. Thus, this case indicates that the cause of the packet loss is due to an increase in the lossyness of the network, not due to insufficient available bandwidth.

Case 4a: when Max Nr, QDF1 and QDF2 are increasing and the network delay is decreasing. A decreasing network delay may be indicated by QDF1 divided by QDF2 being less than one. The increase in Max Nr indicates that there is an increase in packet loss. This is confirmed by the increase in QDF1 and QDF2. The decrease in network delay is indicative of sufficient available bandwidth for the transmitting and/or receiving device. Thus, this case indicates that the cause of the packet loss is due to an increase in the lossyness of the network, not due to insufficient available bandwidth.

Case 4b: when Max Nr, QDF1, QDF2 and the network delay are increasing. An increasing network delay may be indicated by QDF1 divided by QDF2 being greater than one. The increase in Max Nr indicates that there is an increase in packet loss. This is confirmed by the increase in QDF1 and QDF2. The increase in network delay is indicative of either an increase in the bandwidth utilization (e.g. increasing transmission bitrate) or that the bandwidth availability of the network has decreased. Thus, this case indicates that the cause of the packet loss is due to a decrease in the available bandwidth (either due to an increase in the transmission bitrate or decrease in the available network bandwidth).

Case 5: when Max Nr is decreasing. The decrease in Max Nr indicates that there is a decrease in packet loss. The decrease in packet loss is indicative of an increase in the available bandwidth (either due to a decrease in the transmission bitrate or an increase in the available network bandwidth).

For the cases described above other suitable measures of packet loss and network delay or bandwidth availability may be used.

In case 1, the cause of the packet loss is due to an increasingly lossy network. QDF1 and QDF2 were both decreasing which indicates improving network conditions other than packet loss. Thus the quality manager 15 can determine to use a larger amount of redundancy, e.g. a redundancy amount derived from Max Nr as there is sufficient bandwidth available in the network. Furthermore, since decreasing QDF1 and QDF2 indicate improving network characteristics other than packet loss, the quality manager 15 may, for example, increase the transmission bitrate. In this case, the quality manager 15 may set QDFo to be a modified version of the QDF1 value where the weighting for packet loss is zero and the weighting for delay is increased, for example, as shown in table 5. Using the example weighting factors in table 1, the modified QDF1 will have a network delay weighting of 0.4. The transmission bitrate may then be adapted based on the modified QDF1 value (which is likely to lead to an increase in the transmission bitrate as QDF1 is decreasing).

TABLE 5

| Network Metric | Weighting for QDF1 | Weighting for modified QDF1 |
|---|---|---|
| Network Delay | $W_D$ | $(W_D + W_{PL})$ |
| Network packet loss | $W_{PL}$ | 0 |
| Network Jitter | $W_J$ | $W_J$ |
| Packet reception Gap | $W_G$ | $W_G$ |
| Burst loss | $W_{BL}$ | $W_{BL}$ |

In cases 2 and 4b, the cause of packet loss is due to a decrease in the available bandwidth. To compensate for the packet loss due to that cause, the quality manager 15 can decrease the transmission bitrate and/or the amount of redundancy used. For example, Max Nr may be lowered by a predetermined amount (e.g. Max Nr−x) and so the lower (Max Nr−x) may be used to determine the amount of redundancy. For these cases, the quality manager 15 may set QDFo to be the QDF1 value (which is likely to lead to a decrease in the transmission bitrate as QDF is increasing).

In case 3, the cause of the packet loss is due to an increasingly lossy network. Thus the quality manager 15 can determine to use a larger amount of redundancy, e.g. a redundancy amount derived from Max Nr as there is sufficient bandwidth available in the network. Furthermore, in this case, there is an increase in QDF2 and a decrease in QDF1, which indicates worsening network characteristics other than network delay. Thus, in this case, the quality manager 15 may set QDFo to be the modified version of the QDF1 value where the weighting for packet loss is zero and the weighting to delay increased, as shown in table 5. The transmission bitrate may then be adapted based on the modified QDF1 value (which is likely to lead to an increase in the transmission bitrate as QDF1 is decreasing).

In case 4a, the cause of the packet loss is due to an increasingly lossy network. Thus the quality manager 15 can determine to use a larger amount of redundancy, e.g. a redundancy amount derived from Max Nr as there is sufficient bandwidth available in the network. Furthermore, in this case, there is an increase in QDF1 and QDF2 and a decrease in network delay, which indicates worsening network characteristics other than network delay. Thus, in this case, the quality manager 15 may set QDFo to be the modified version of the QDF1 value where the weighting for packet loss is zero and the weighting to delay increased, as shown in table 5. The transmission bitrate may then be adapted based on the modified QDF1 value (which is likely to lead to an increase in the transmission bitrate as QDF1 is decreasing).

In case 5, the packet loss is decreasing and so the quality manager 15 may determine to use a lower amount of redundancy. As the packet loss is decreasing, the quality manager 15 may maintain or increase the transmission bitrate. The quality manager 15 may adjust the transmission bitrate in dependence on a modified QDF1 value, as shown in table 5. The QDFo may be set to be QDF1 but with the weighting for network loss being added to the network delay (i.e. 0.1+0.3) and a zero network loss weighing.

Figure 3:
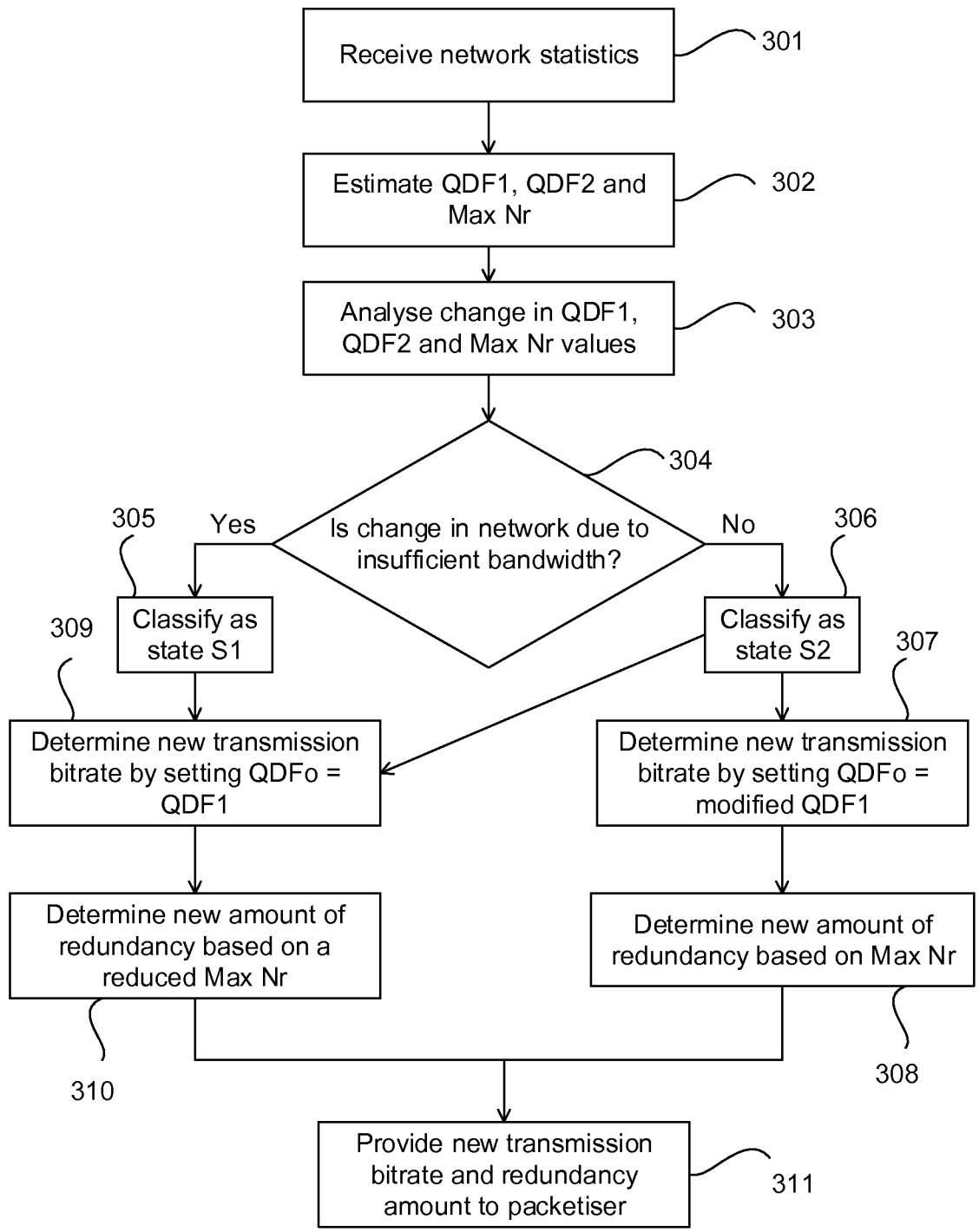
FIG. 3 shows an example flow chart for determining a transmission bitrate and an amount of redundancy.

FIG. 3 is a flow diagram that summarises the above process of coordinating the QDF1, QDF2 and Max Nr measures to determine an appropriate transmission bitrate and amount of redundancy.

At step 301, the network statistics are received. At step 302, the QDF1, QDF2 and the Max Nr measures are determined from the network statistics.

Preferably, steps 301 and 302 are carried out by the quality estimator 14 and the subsequent steps are carried out by the quality manager 15.

At step 303, the change in the QDF1, QDF2 and Max Nr values from previous values is analysed to determine the cause of the change in those values. At step 304, if it is determined that the cause of the change is due to insufficient bandwidth (e.g. because transmitting device is transmitting at a bitrate that is greater than the available bandwidth), then the process moves on to step 305. This corresponds to case 2 or 4b described above. If the cause is not due to insufficient bandwidth (and is, e.g., due to a lossy network), then the process moves on to step 306. This corresponds to case 1, 3 or 4a above.

The different cases above may be further classified into 2 different states: state 1 (S1) or state 2 (S2). As shown in FIG. 3, at step 304, if the answer is "yes" then the network can be classified as being in state S1 (step 305) and if the answer is "no" then the network can be classified as being in state S2 (step 306). Cases 2 and 4b may be classified as S1 and cases 1, 3, 4a and 5 as S2.

In some cases, the QDFo and Max Nr may be determined in dependence on the history of past states and the present state. Four different transitions: S1 to S1; S1 to S2; S2 to S1; and S2 to S2 are possible between the past and present state. Optimal QDFo and Max Nr for nth measurement instance is obtained from a past number, e.g. two or three, of states and the present state. For example, if the past two states were S1 and the present state is S2, then the process may move on to step 309 instead of step 307 (as depicted by the arrow from 306 to 309 in FIG. 3). If the past two states are S2 and the present state is S2, then the process moves on to step 307. This helps avoid multiple switching across the states for minor network fluctuations.

At step 309, a new transmission bitrate is determined based on using QDF1, as mentioned above for case 2 or 4b. At step 310, a new amount of redundancy is determined based on a reduced Max Nr, as mentioned for case 2 or 4b above.

At step 307, a new transmission bitrate is determined based on using a modified QDF1 as mentioned for cases 1, 3 and 4a above. At step 308, a new amount of redundancy is determined based on a Max Nr, as mentioned for cases 1, 3 or 4a above.

The new transmission bitrate and redundancy amount from steps 310 or 308 is then provided to the packetiser 16 at step 311. The packetiser then packetises media data from received from the encoder 13 and redundancy data from a buffer (not shown) in dependence on the redundancy amount received from the quality manager 15. The packetiser generates the packets so that the transceiver 11 transmits the packets at the determined transmission bitrate.

The amount of redundancy used may be dependent on the variation of QDF1, QDF2 and Max Nr values over time. For example, minor network fluctuations may cause the values to change which may lead to multiple switching between the cases above. The quality estimator 14 may periodically determine the quality of the network, e.g. at a rate of once every 100 ms, and so a new case may be detected every 100 ms. This may, in turn, lead to unnecessary increasing/decreasing of the amount of redundancy used due to the minor fluctuations. Thus, for example, when cases 2 or 4b are detected, the quality manager 15 may continue to use the lower Max Nr–x amount (for case 2 or 4b) for a predetermined time (e.g. 300 ms, 400 ms or 500 ms) even if other cases are determined during that predetermined time.

Max Nr and the reduced Max Nr may be set to Nr0, which may then be further optimised. Nr0 may be determined in dependence on the history of past states and the present state. Optimal Nr0 for nth measurement instance is obtained from the past 2 states and present state as shown in Table 6. If any one of the present or past 2 states is S1, then the optimum Nr0 will be estimated from past optimum Nr0 decremented by 1 i.e. $Nr0(n)=Nr0(n-1)-1$. Also, if the present and past 2 states are S2, then optimum Nr0 is considered as Max Nr. This helps avoid multiple switching across the states for minor network fluctuations.

TABLE 6

| State at n-2 | State at n-1 | State at n | Nr0(n) |
|---|---|---|---|
| S1 or S2 | S1 or S2 | S1 | Nr0(n-1)-1 |
| S2 | S2 | S2 | Max Nr(n) |
| S1 or S2 | S1 | S1 or S2 | Nr0(n-1)-1 |
| S1 | S1 or S2 | S1 or S2 | Nr0(n-1)-1 |

By determining the cause of the change in the quality of the network, an appropriate method of adapting transmission parameters (such as the transmission bitrate and the amount of redundancy) can be selected. This leads to a more stable media stream as the network bandwidth is not overloaded when trying to correct for packet loss as the cause of the packet loss has been determined first and so an appropriate method of correcting for that cause can be selected. The cause can be determined using measures of the network delay and packet loss. Usefully and efficiently, these measures can be obtained from packets that are already being used for the media stream. Thus a transmitting device is capable of efficiently measuring a change in the network, determining a cause for the change from the measures and adapting the transmission parameters to optimise the transmission stream for the changed network.

The data processing device of FIG. 1 is shown as comprising a number of functional blocks. This is for illustrative purposes only and is not intended to define a strict division between different parts of hardware on a chip or between different programs, procedures or functions in software. The term logic as used herein can refer to any kind of software, hardware, or combination of hardware and software.

Data processing devices configured in accordance with the present invention could be embodied in hardware, software or any suitable combination of hardware and software. A data processing device of the present invention could comprise, for example, software for execution at one or more processors (such as at a CPU and/or GPU), and/or one or more dedicated processors (such as ASICs), and/or one or more programmable processors (such as FPGAs) suitably programmed so as to provide functionalities of the data processing device, and/or heterogeneous processors comprising one or more dedicated, programmable and general purpose processing functionalities. In preferred embodiments of the present invention, the data processing device comprises one or more processors and one or more memories having program code stored thereon, the data processors and the memories being such as to, in combination, provide the claimed data processing device and/or perform the claimed methods.

The term software as used herein includes executable code for processors (e.g. CPUs and/or GPUs), firmware, bytecode, programming language code such as C or OpenCL, and modules for reconfigurable logic devices such as FPGAs. Machine-readable code includes software and code for defining hardware, such as register transfer level (RTL) code as might be generated in Verilog or VHDL.

Any one or more of the algorithms and methods described herein could be performed by one or more physical processing units executing program code that causes the unit(s) to perform the algorithms/methods. The or each physical processing unit could be any suitable processor, such as a CPU or GPU (or a core thereof), or fixed function or programmable hardware. The program code could be stored in non-transitory form at a machine readable medium such as an integrated circuit memory, or optical or magnetic storage. A machine readable medium might comprise several memories, such as on-chip memories, computer working memories, and non-volatile storage devices.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A method of transmitting a stream of packets over a network, the method comprising the steps of:
    a transmitting device maintaining a measure of network quality;
    the transmitting device detecting a change of delay in the network and a change in packet loss as part of analyzing the measure of network quality and using the detected change of delay and packet loss to determine whether the bandwidth of the network is degrading, beyond a predetermined threshold, the network quality for a transmission over the network to thereby determine a cause for packet loss;
    the transmitting device determining a transmission bitrate and a proportion of redundancy in dependence on the analysis and on the change in delay;
    the transmitting device packetising media data and redundancy data in dependence on the determined proportion to generate a stream of packets; and
    the transmitting device transmitting the generated stream at the determined transmission bitrate.

2. The method as claimed in claim 1, wherein the step of the transmitting device determining the transmission bitrate and the proportion of redundancy comprises the transmitting device determining a transmission bitrate that is lower than a current transmission bitrate responsive to detecting the change of delay being an increase.

3. The method as claimed in claim 2, wherein the step of the transmitting device transmitting comprises the transmitting device transmitting at the determined lower transmission bitrate and maintaining transmission of the stream at the lower transmission bitrate for a predetermined amount of time irrespective of detected changes of delay during the predetermined amount of time.

4. The method as claimed in claim 1, wherein the step of the transmitting device determining the transmission bitrate and the proportion of redundancy comprises the transmitting device determining a proportion of redundancy that is lower than a current proportion of redundancy responsive to detecting the change of delay being an increase.

5. The method as claimed in claim 1, further comprising the step of the transmitting device determining that the bandwidth of the network is less than the current transmission bitrate responsive to detecting the change of delay being an increase.

6. The method as claimed in claim 1, wherein the step of the transmitting device determining the transmission bitrate and the proportion of redundancy further comprises the transmitting device determining the proportion of redundancy in dependence on the change in packet loss.

7. The method as claimed in claim 6, wherein the step of the transmitting device determining the transmission bitrate and the proportion of redundancy comprises the transmitting device determining a proportion of redundancy that is higher than a current proportion of redundancy and determining a transmission bitrate that is higher than a current transmission bitrate responsive to detecting the change in packet loss being an increase and the change of delay being a decrease.

8. The method as claimed in claim 6 wherein the step of the transmitting device determining the transmission bitrate and the proportion of redundancy comprises the transmitting device determining a proportion of redundancy that it is higher than a current proportion of redundancy and determining the transmission bitrate in dependence on a measure of packet loss responsive to detecting the change in packet loss being an increase and the change of delay being a decrease.

9. The method as claimed in claim 6, further comprising the step of the transmitting device determining that the lossyness of the network has increased responsive to detecting the change in packet loss being an increase and the change of delay being a decrease.

10. The method as claimed in claim 1, wherein the step of the transmitting device determining the transmission bitrate and the proportion of redundancy comprises, determining a transmission bitrate that is lower than the current transmission bitrate responsive to determining that the bandwidth of the network is degrading, beyond a predetermined threshold, the network quality for the transmission over the network.

11. The method as claimed in claim 10, wherein the step of the transmitting device transmitting comprises the transmitting device transmitting at the determined lower transmission bitrate, and wherein the method further comprises the transmitting device maintaining transmission of the stream at the lower transmission bitrate for a predetermined amount of time irrespective of detected changes in the measure of network quality during the predetermined amount of time.

12. The method as claimed in claim 10 wherein the step of the transmitting device determining the transmission bitrate and the proportion of redundancy comprises the transmitting device determining a proportion of redundancy that is lower than a current proportion of redundancy.

13. The method as claimed in claim 1, wherein the step of the transmitting device analyzing comprises the transmitting device determining that the lossyness of the network has increased responsive to determining that the bandwidth of the network is not degrading, beyond a predetermined threshold, the network quality for the transmission over the network.

14. The method as claimed in claim 1, wherein:
the method comprises the transmitting device detecting a decrease in delay in the network as part of analyzing the measure of network quality; and
the step of the transmitting device determining the transmission bitrate and the proportion of redundancy comprises the transmitting device determining a proportion of redundancy that is higher than a current proportion of redundancy and determining a transmission bitrate that is higher than the current transmission bitrate.

15. The method as claimed in claim 1, wherein the stream comprises a Voice over Internet Protocol stream and wherein the packetising comprises packetising in accordance with the RTP protocol standard.

16. A device for transmitting a stream of packets over a network, the device comprising one or more processors, one or more computer-readable tangible storage devices, and program instructions stored on at least one of the one or more storage devices for execution by at least one of the one or more processors, the combination of said processors and program instructions comprising:
a quality estimator configured to maintain a measure of network quality;
a quality manager configured to:
detect a change of delay in the network and a change in packet loss as part of analyzing the measure of network quality and use the detected change of delay and packet loss to determine whether the bandwidth of the network is degrading, beyond a predetermined threshold, the network quality for a transmission over the network to thereby determine a cause for packet loss; and
determine a transmission bitrate and a proportion of redundancy in dependence on the analysis and on the change in delay; and
a packetiser configured to packetise media data and redundancy data in dependence on the determined proportion to generate a stream of packets; and
the device further comprising a transceiver configured to transmit the generated stream at the determined transmission bitrate.

17. The device as claimed in claim 16, wherein the quality manager is configured to determine a transmission bitrate that is lower than a current transmission bitrate if the detected change is an increase in the delay.

18. The device as claimed in claim 16, wherein the quality manager is configured to determine a proportion of redundancy that is lower than a current proportion of redundancy responsive to detecting the change in the delay being an increase.

19. The device as claimed in claim 16, wherein the quality manager is configured to determine that the bandwidth of the network is less than the current transmission bitrate responsive to detecting the change in the delay being an increase.

20. A non-transitory machine readable storage medium having stored thereon computer-executable instructions that when executed cause at least one processor to:
maintain a measure of network quality;
detecting a change of delay in the network and a change in packet loss as part of analyzing the measure of network quality and using the detected change of delay and packet loss to determine whether the bandwidth of a network is degrading, beyond a predetermined threshold, the network quality for a transmission over the network to thereby determine a cause for packet loss;
determine a transmission bitrate and a proportion of redundancy in dependence on the analysis and on the change in delay;
packetize media data and redundancy data in dependence on the determined proportion to generate a stream of packets; and
transmit the generated stream at the determined transmission bitrate.

* * * * *